(12) United States Patent
Berka et al.

(10) Patent No.: US 6,566,939 B1
(45) Date of Patent: May 20, 2003

(54) PROGRAMMABLE GLITCH FILTER

(75) Inventors: David M. Berka, Colorado Springs, CO (US); Travis A. Bradfield, Colorado Springs, CO (US); Tracy R. Spitler, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/923,526

(22) Filed: Aug. 6, 2001

(51) Int. Cl.[7] .................................................. H03B 1/00

(52) U.S. Cl. ..................................................... 327/552

(58) Field of Search ............................ 327/31, 34, 551, 327/552, 553, 558

(56) References Cited

U.S. PATENT DOCUMENTS 5,289,060 A * 2/1994 Elnashar et al. ............... 327/18
5,563,532 A * 10/1996 Wu et al. ..................... 327/165
6,246,276 B1 * 6/2001 Arkas et al. ................. 327/166

* cited by examiner

*Primary Examiner*—Jeffrey Zweizig
(74) *Attorney, Agent, or Firm*—Carstens, Yee & Cahoon, LLP

(57) ABSTRACT

An apparatus and method for filtering glitches in data signals are provided. The apparatus and method provide a programmable glitch filter that may be programmed to filter glitches of different depths. The apparatus and method further provide a glitch filter that is programmable and incorporates a synchronizer for synchronizing the filtered output from the glitch filter to a different clock domain than that of the clock input.

18 Claims, 3 Drawing Sheets

PROGRAMMABLE GLITCH FILTER

BACKGROUND OF THE INVENTION

1. Technical Field

The present invention is directed to an improved apparatus and method for increasing the reliability of data in microchips by providing an improved signal filter. More specifically, the present invention is directed to an improved and programmable glitch filter.

2. Description of Related Art

In microchip technology, the reliability of data signals in the microchips is an ever-increasing important issue. By reliability what is meant is the amount of certainty that the data signals are not corrupted by noise imparted to the data signal. Noise may be imparted to a data signal from a number of different sources, one of which is crosstalk between signals lines.

A number of solutions are available to assure data validity. One of these methods involves filtering glitches that can lead to corrupt data. With this approach, glitch filters are used to filter out glitches in the data signals.

The known glitch filters are of a fixed depth type. By fixed depth, what is meant is that the glitch filter can only examine the data signal for a fixed, non-adjustable, length of time to determine if a glitch occurs. Another way of saying this is that the glitch filter can filter the data signal for only a fixed, non-adjustable length of time.

For example, if a signal was to be filtered so that glitches of 5 ns or less are filtered out and ignored, then that is all the filter can do. Now, if two signals are to be filtered for different size glitches, one for 5 ns or less and the other for 10 ns or less, two separate filters would have to be designed and implemented. This results in taking more design time and more complexity in the microchip design. Thus, it would be beneficial to have an apparatus and method for filtering glitches that is not limited to a fixed depth. It would be beneficial to have a glitch filter that may be programmed to operate on different glitch depths.

SUMMARY OF THE INVENTION

The present invention provides an apparatus and method for filtering glitches in data signals. The present invention provides a programmable glitch filter that may be programmed to filter glitches of different depths. The present invention further provides a glitch filter that is programmable and incorporates a synchronizer for synchronizing the filtered output from the glitch filter to a different clock domain than that of the clock input. These and other features of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1A:
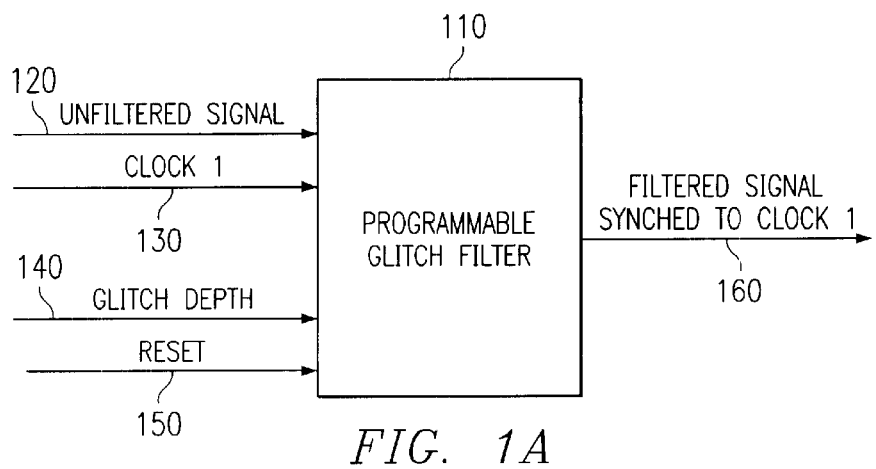
FIG. 1A is an exemplary block diagram illustrating a high level operation of the present invention.

FIG. 1A is an exemplary block diagram illustrating the operation of the present invention. As shown in FIG. 1A, a programmable glitch filter 110 according to the present invention receives, as input, an unfiltered data signal 120, a clock signal 130, a glitch depth signal 140, and a reset signal 150. The programmable glitch filter 110 of the present invention operates on the unfiltered data signal 120 to filter out glitches of various depths based on the glitch depth indicated by the glitch depth signal 140. In this way, the depth of the glitches filtered out by the programmable glitch filter is programmed by the glitch depth signal. The resulting output 160 of the programmable glitch filter 110 is a filtered signal synched to the clock signal 130.

Figure 1B:
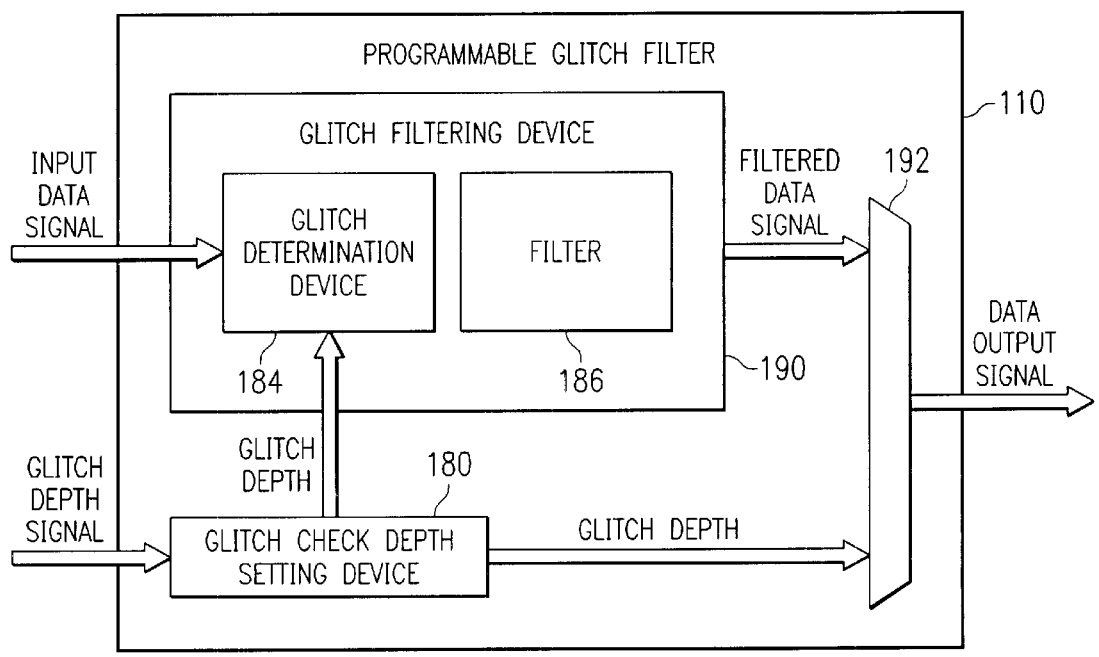
FIG. 1B is an exemplary block diagram illustrating the primary operational components of the programmable glitch filter of the present invention.

FIG. 1B is an exemplary block diagram illustrating the primary operational components of the present invention. As shown in FIG. 1B, the programmable glitch filter 110 includes a glitch check depth setting device 180 that sets a glitch check depth, e.g., the number of clock cycles within which a glitch may be filtered out of an input data signal. The glitch check depth setting device 180 may set the glitch check depth based on an input signal used to program the glitch check depth, for example.

The glitch check depth setting device 180 sets the glitch check depth of the glitch determination device 184 in the glitch filtering device 190. The glitch determination device 184 operates, when there is a difference between the input data signal and the data output signal, to determine if a glitch occurs within the programmed glitch check depth. If a glitch occurs during the programmed glitch check depth, the glitch determination device 184 notifies the filter 186 which filters out the glitch. When the input data signal and the output data signal are different, and a glitch does not occur during the programmed glitch check depth, the input data signal is passed out of the programmable glitch filter unchanged.

The output from the glitch filtering device 190 is provided a multiplexer 192 along with a glitch depth signal from glitch check depth setting device 180. If the glitch depth signal indicates that no filtering is to be performed, the input data signal is output as the data output signal with no filtering performed. If the glitch depth signal indicates that filtering is to be performed, the multiplexer 192 outputs the filtered input data signal as the data output signal.

Figure 2:
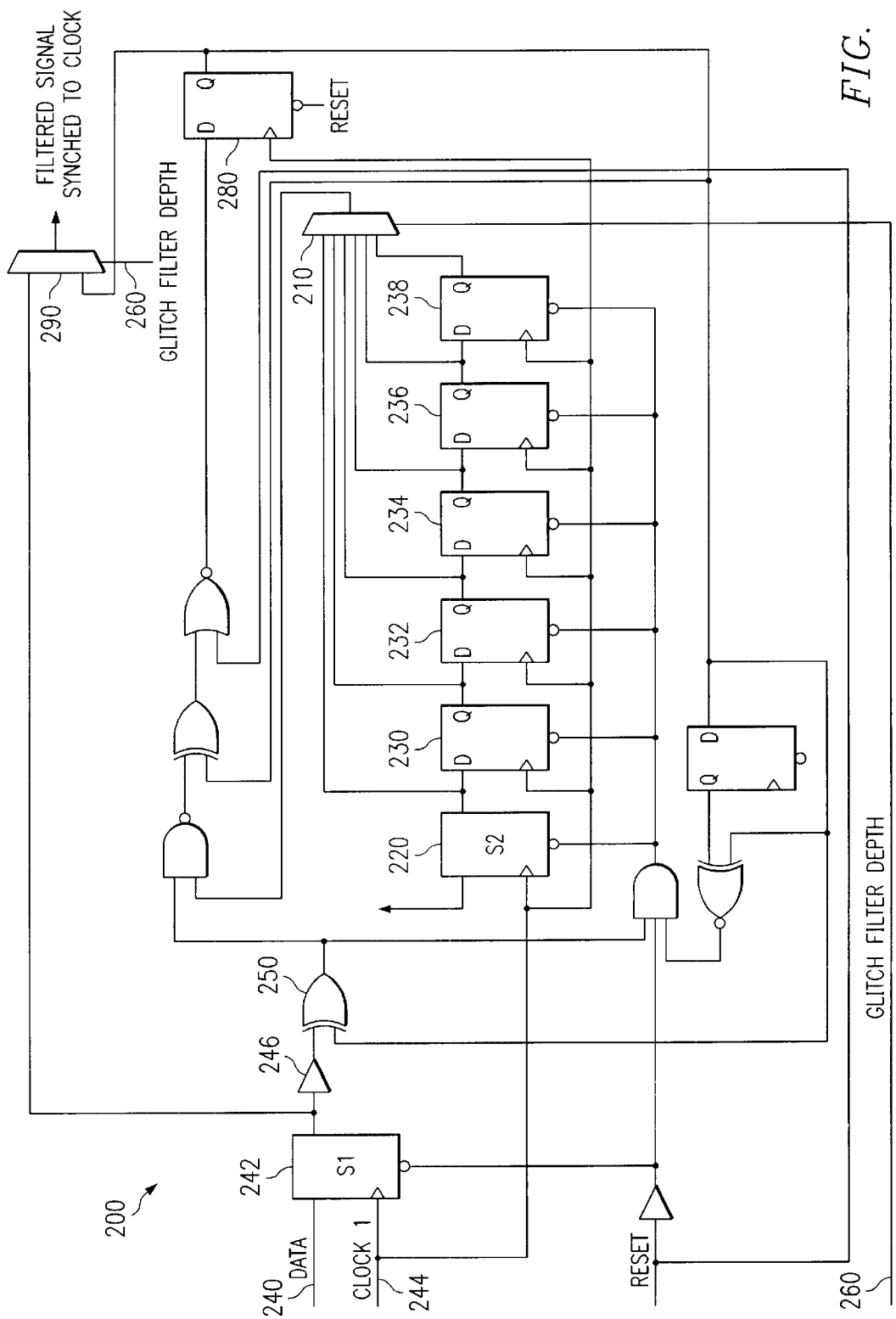
FIG. 2 is an exemplary circuit diagram illustrating one embodiment of the present invention.

FIG. 2 is an exemplary circuit diagram of a programmable glitch filter in accordance with one exemplary embodiment of the present invention. As shown in FIG. 2, the programmability of the glitch filter 200 of the present invention stems from the input of a glitch check depth signal 260, or glitch depth signal, to multiplexer 1 210 in conjunction with synchronizer 220 and flip-flops 230–238. The glitch check depth signal 260 programs the multiplexer 1 210 to look at certain ones of the outputs from synchronizer 220 and flip-flops 230–238 thereby modifying the filtering time length. The glitch check depth signal 260 also serves as a selection signal for multiplexer 290 which selects the output from flip-flop 280 if the glitch check depth signal 260 is not 000 or 001, as described hereafter. The multiplexer 290 selects the output signal from synchronizer 242 as the output signal for the programmable glitch filter if the glitch check depth signal is 000 or 001.

With the circuit shown in FIG. 2, a data signal 240 is input to the programmable glitch filter 200 via a data signal line. The data signal 240 is input to synchronizer 242 which synchronizes the data signal to the clock signal 244. The synchronized data signal is then output to buffer 246 and multiplexer 290.

The synchronized data signal in buffer 246 is output to XOR gate 250. The XOR gate 250 compares the synchronized data signal from buffer 246 to the output from flip flop 280. If the two signals have the same value, e.g., 0 or 1, then the output is left unchanged. If the two signals are different, then synchronizer 220 and flip-flops 230–238 are allowed to come out of reset. In such a case, the glitch filter 200 then operates on the synchronized data signal to filter out glitches having a time length designated by the glitch check depth signal 260.

When the synchronizer 220 and flip-flops 230–238 are enabled, i.e. out of reset and the synchronized input data signal is different from the output data signal from the flip flop 238, the synchronizer 220 sends a single bit 1 signal to flip-flop 230 after two clock cycles (because the synchronizer 220 contains two flip-flops). The single bit 1 signal will then propagate from flip-flop to flip-flop with each subsequent clock cycle. Thus, in one clock cycle the single bit 1 signal is sent from the flip-flop 230 to 232, in two clock cycles the signal goes from flip-flop 232 to flip-flop 234, and so on. Of course, synchronizer 220 keeps sending 1's on each clock cycle (it initially takes 2 clock cycles to get the "1" data signal out). Thus, in reset all outputs are 0. When the synchronizer 220 and flip-flops 230–238 are brought out of reset, all the 0 outputs become 1's in a shifting process from left to right.

The outputs from the synchronizer 220 and the flip-flops 230–238 are sent to the multiplexer 210. When the multiplexer 210 receives a "1" signal from each of the synchronizer 220 and the flip-flops 230–238 within the programmed filter depth, the multiplexer 210 determines that the input data signal is valid, i.e. there is no glitch in the data signal.

There are times, e.g., when a glitch in the input data signal occurs, when the input data signal will change during the period that the single bit "1" signal is propagating from the synchronizer 220 to each of the flip-flops 230–238. If the input data signal changes during the filter time period, i.e. before the multiplexer 210 receives a "1" signal from all of the flip-flops 230–238 for the filter time period, then the synchronizer 220 will be reset and held there until the input data signal and the output data signal are again different from one another.

The glitch check depth signal, in a preferred embodiment, is a three bit signal, although the glitch check depth signal may be any type of signal that can be used to program the multiplexer 210 to operate on a particular glitch depth. In the preferred embodiment, based on the binary value of the three bit glitch check depth signal, the multiplexer 210 changes the filter depth. The following is a table of the possible three bit binary values for the glitch check depth signal and the corresponding filter depth to which the multiplexer 210 is set.

TABLE 1

Glitch Check Depths

| Glitch Check Depth Signal Value | Filter Depth |
| --- | --- |
| 000 | Pass signal through (no filtering) |
| 001 | Pass signal through (no filtering) |
| 010 | 3–4 Clock cycles |
| 011 | 4–5 Clock cycles |
| 100 | 5–6 Clock cycles |
| 101 | 6–7 Clock cycles |
| 110 | 7–8 Clock cycles |
| 111 | 8–9 Clock cycles |

As an example of how the three bit glitch check depth signal may be used to program the programmable glitch filter of the present invention, assume that for a particular application, a designer wishes to filter out glitches in the range of five to six clock cycles. In this case, the designer would send a glitch check depth signal 260 having a value of "100" to the multiplexer 210. Based on this glitch check depth signal, the multiplexer 210 is programmed to look at the outputs from the synchronizer 220 and flip-flops 230–232. If all outputs from the synchronizer 220 and flip-flops 230–232 are "1", the multiplexer 210 passes the signal through to multiplexer 290. If one of the outputs from synchronizer 220 and flip-flops 230–232 is "0", the glitch filter is reset and held in reset until the comparison made by XOR gate 250 indicates a difference, at which time the operation repeats.

In addition to the above, the programmable glitch filter of the present invention may be provided with a second clock signal to which the filtered signal may be synched when output from the programmable glitch filter. In this way, the filtered signal may be synched to a different clock signal from that of the input data signal should the particular application require a different clock signal.

Figure 3:
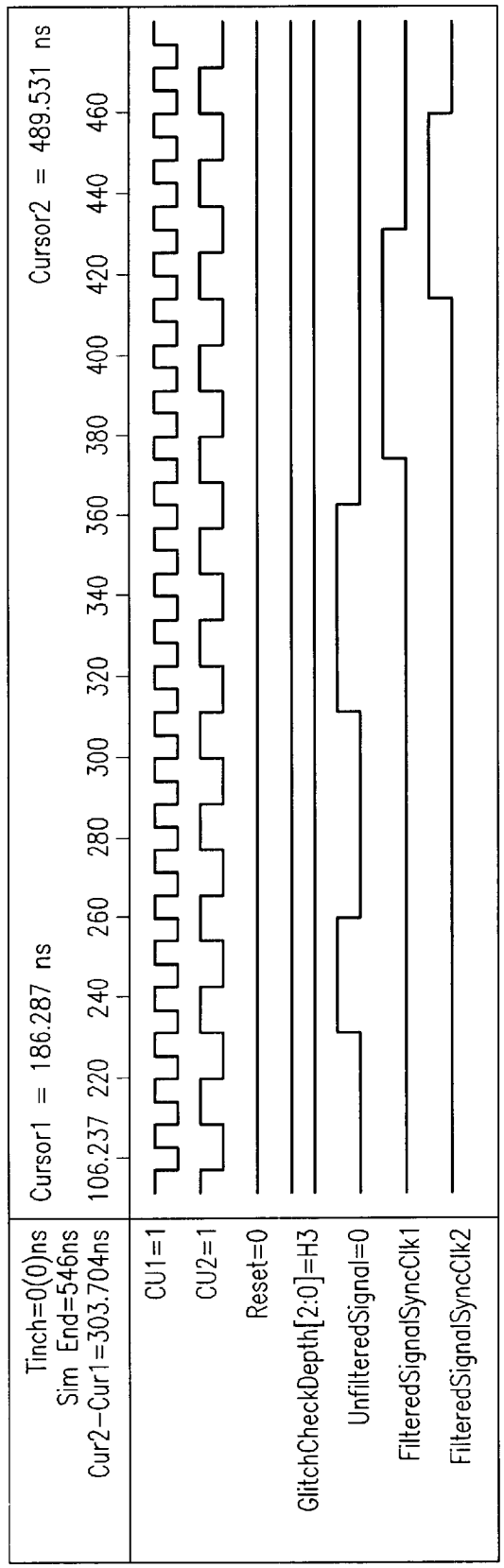
FIG. 3 is an exemplary diagram illustrating the filtering of clock signals using the present invention.

FIG. 3 is an exemplary diagram illustrating the results of operation of the programmable glitch filter of the present invention on a data input signal. As shown in FIG. 3, the unfiltered signal, or data input signal, includes a glitch (the first rise) that must be filtered. By use of the present invention, this glitch is removed in the resultant output signal (FilteredSignalSyncClk1 and/or FilteredSignalSyncClk2).

Thus, the present invention provides a programmable glitch filter in which the glitch check depth may be programmed into the filter. In this way, a single glitch filter may be used for a plurality of different uses. This allows for a "general purpose" glitch filter to be provided and used in a number of different applications without having to specially design each glitch filter for each application.

While the present invention has been described in terms of an exemplary circuit shown in FIG. 2, it should be appreciated by those of ordinary skill in the art that FIG. 2 is only exemplary and is not intended to imply any limitations on the configuration of the programmable glitch filter of the present invention. Many modifications to the circuitry shown in FIG. 2 may be made without departing from the spirit and scope of the present invention. For example, in order to obtain a larger maximum glitch check depth, additional flip-flops may be provided whose outputs 20 are sent to multiplexer 210. Similarly, in order to provide a smaller maximum glitch check depth, fewer flip-flops may be provided.

While the present invention has been described in terms of a hardware based apparatus, those of ordinary skill in the art will appreciate that the processes of the present invention are capable of being distributed in the form of a computer readable medium of instructions having a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A programmable glitch filter, comprising:
    a glitch check depth setting device that sets a glitch check depth based on a glitch check depth input signal;
    a glitch determination device coupled to the glitch check depth setting device, the glitch determination device determining if a glitch occurs in an input signal within the glitch check depth; and
    a glitch filtering device coupled to the glitch determination device that filters out the glitch if the glitch falls within the glitch check depth.

2. The programmable glitch filter of claim 1, wherein the glitch determination device includes a plurality of flip-flops, wherein the glitch check depth identifies a set of flip-flops from the plurality of flip-flops whose outputs are examined to determine if a glitch occurs.

3. The programmable glitch filter of claim 2, wherein if the outputs of the set of flip-flops are the same, the glitch determination device determines that a glitch has not occurred within the glitch check depth.

4. The programmable glitch filter of claim 2, wherein if at least one of the outputs of the set of flip-flops is different from the remaining outputs of the set of flip-flops, the glitch determination device determines that a glitch has occurred within the glitch check depth.

5. The programmable glitch filter of claim 2, wherein the glitch filtering device filters the glitch by resetting the plurality of flip-flops.

6. The programmable glitch filter of claim 1, wherein the glitch filtering device synchronizes an output of the glitch filtering device to a clock signal.

7. The programmable glitch filter of claim 6, wherein the clock signal is different than a clock signal associated with the input signal.

8. The programmable glitch filter of claim 1, further comprising a programmable glitch filter enabling device that enables the programmable glitch filter based on an occurrence of an event.

9. The programmable glitch filter of claim 8, wherein the event is a difference in an input signal to the programmable glitch filter and an output signal from the programmable glitch filter.

10. A method of filtering an input signal, comprising:
    setting a glitch check depth based on a glitch check depth input signal;
    determining if a glitch occurs in the input signal within the glitch check depth; and
    filtering out the glitch if the glitch falls within the glitch check depth.

11. The method of claim 10, wherein the glitch check depth identifies a set of flip-flops from a plurality of flip-flops whose outputs are examined to determine if a glitch occurs.

12. The method of claim 11, wherein if the outputs of the set of flip-flops are the same, it is determined that a glitch has not occurred within the glitch check depth.

13. The method of claim 11, wherein if at least one of the outputs of the set of flip-flops is different from the remaining outputs of the set of flip-flops, it is determined that a glitch has occurred within the glitch check depth.

14. The method of claim 11, wherein filtering the glitch includes resetting the plurality of flip-flops.

15. The method of claim 10, further comprising synchronizing an output signal to a clock signal.

16. The method of claim 15, wherein the clock signal is different than a clock signal associated with the input signal.

17. The method of claim 10, wherein the steps of setting a glitch check depth, determining if a glitch occurs in the input signal within the glitch check depth, and filtering out the glitch are performed based on an occurrence of an event.

18. The method of claim 17, wherein the event is a difference in an input signal and an output signal.

* * * * *